(12) United States Patent
Chien et al.

(10) Patent No.: US 11,837,602 B2
(45) Date of Patent: Dec. 5, 2023

(54) SEMICONDUCTOR DEVICE STRUCTURE HAVING A PLURALITY OF THRESHOLD VOLTAGES AND METHOD OF FORMING THE SAME

(71) Applicant: Taiwan Semiconductor Manufacturing Co., Ltd., Hsinchu (TW)

(72) Inventors: Yu-San Chien, Hsinchu (TW); Hsin-Che Chiang, Hsinchu (TW); Chun-Sheng Liang, Changhua County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 268 days.

(21) Appl. No.: 17/328,016

(22) Filed: May 24, 2021

(65) Prior Publication Data
US 2021/0280711 A1 Sep. 9, 2021

Related U.S. Application Data

(62) Division of application No. 16/656,744, filed on Oct. 18, 2019, now Pat. No. 11,018,257.

(51) Int. Cl.
| | |
|---|---|
| *H01L 27/092* | (2006.01) |
| *H01L 29/78* | (2006.01) |
| *H01L 29/66* | (2006.01) |
| *H01L 21/8238* | (2006.01) |

(Continued)

(52) U.S. Cl.
CPC ...... *H01L 27/0924* (2013.01); *H01L 21/0245* (2013.01); *H01L 21/76828* (2013.01); *H01L 21/76831* (2013.01); *H01L 21/76832* (2013.01); *H01L 21/76846* (2013.01); *H01L 21/823807* (2013.01); *H01L 21/823821* (2013.01); *H01L 29/66795* (2013.01); *H01L 29/785* (2013.01)

(58) Field of Classification Search
CPC ............ H01L 27/0924; H01L 27/0886; H01L 27/1211; H01L 29/1054
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |

(Continued)

*Primary Examiner* — Peter M Albrecht
(74) *Attorney, Agent, or Firm* — HAYNES AND BOONE, LLP

(57) ABSTRACT

An embodiment method includes forming a semiconductor liner layer on a first fin structure and on a second fin structure and forming a first capping layer on the semiconductor liner layer disposed on the first fin structure. The method further includes forming a second capping layer on the semiconductor liner layer disposed on the first fin structure, where a composition of the first capping layer is different from a composition of the second capping layer. The method additionally includes performing a thermal process on the first capping layer, the second capping layer, and the semiconductor liner layer to form a first channel region in the first fin structure and a second channel region in the second fin structure. A concentration profile of a material of the first channel region is different from a concentration profile of a material of the second channel region.

20 Claims, 16 Drawing Sheets

(51) Int. Cl.
*H01L 21/768* (2006.01)
*H01L 21/02* (2006.01)

(56) References Cited

U.S. PATENT DOCUMENTS

| | | |
|---|---|---|
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,847,334 B1 * | 12/2017 | More .................. H01L 27/0924 |
| 9,984,937 B1 | 5/2018 | Bi et al. |
| 2014/0175543 A1 | 6/2014 | Glass et al. |
| 2015/0311320 A1 | 10/2015 | Cheng et al. |
| 2016/0329253 A1 | 11/2016 | Liu et al. |
| 2019/0252366 A1 | 8/2019 | Tung |

* cited by examiner

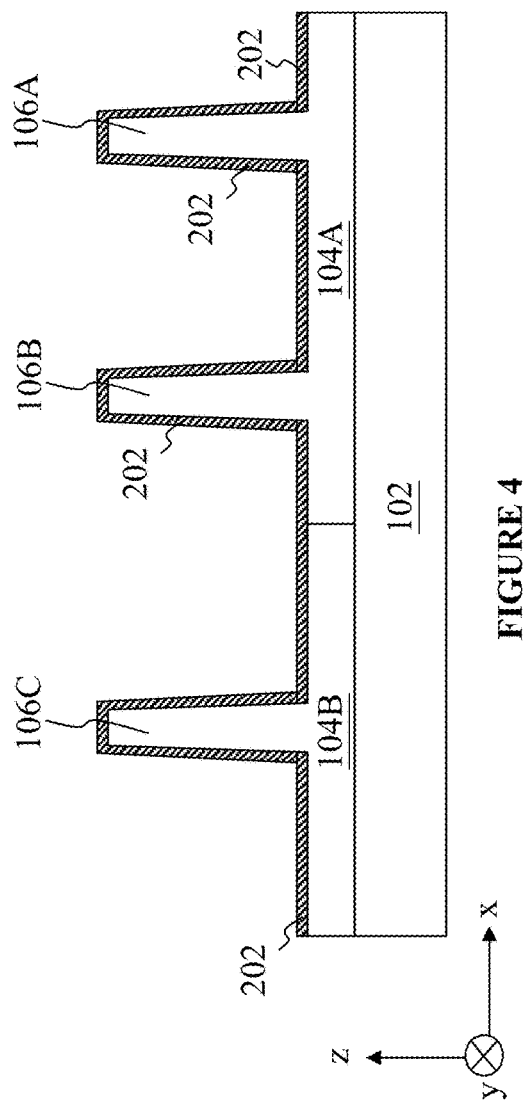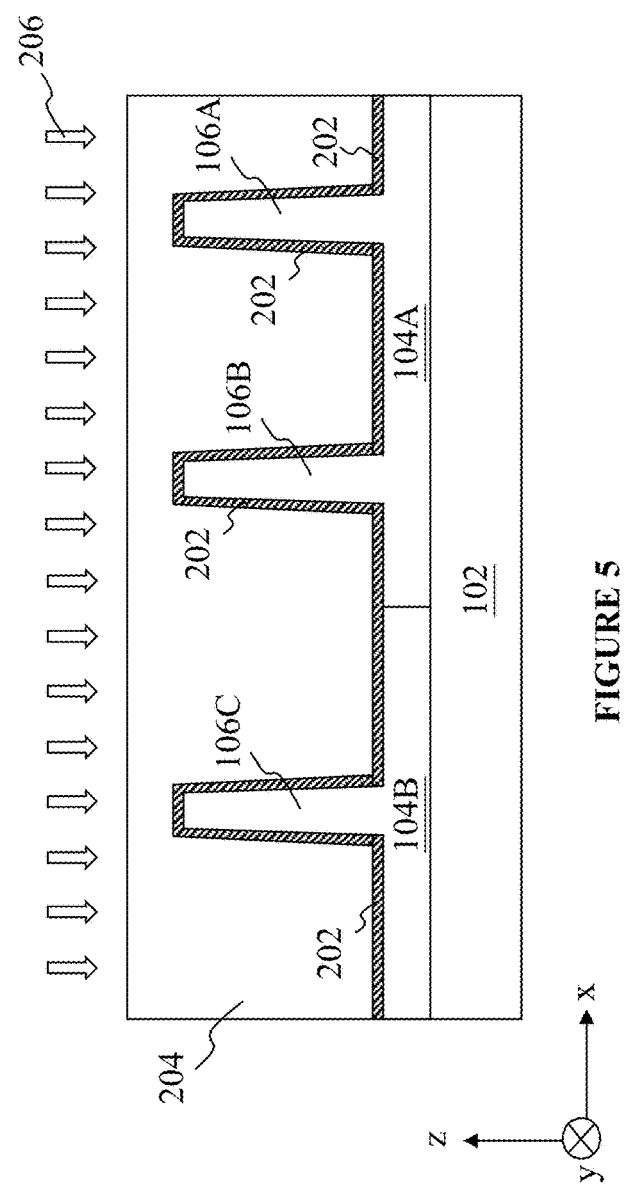

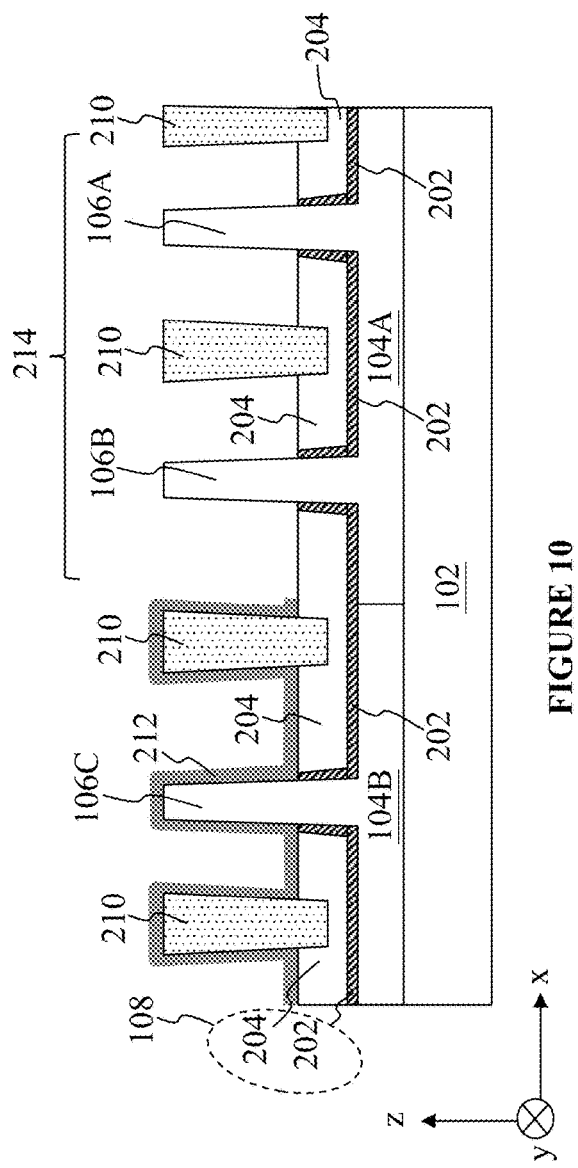
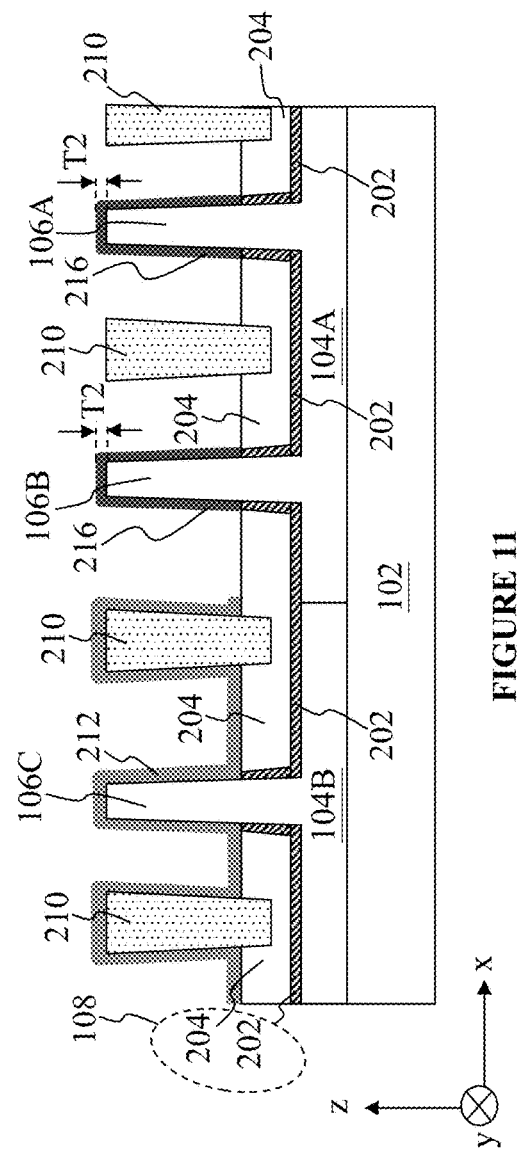
FIGURE 10
FIGURE 11

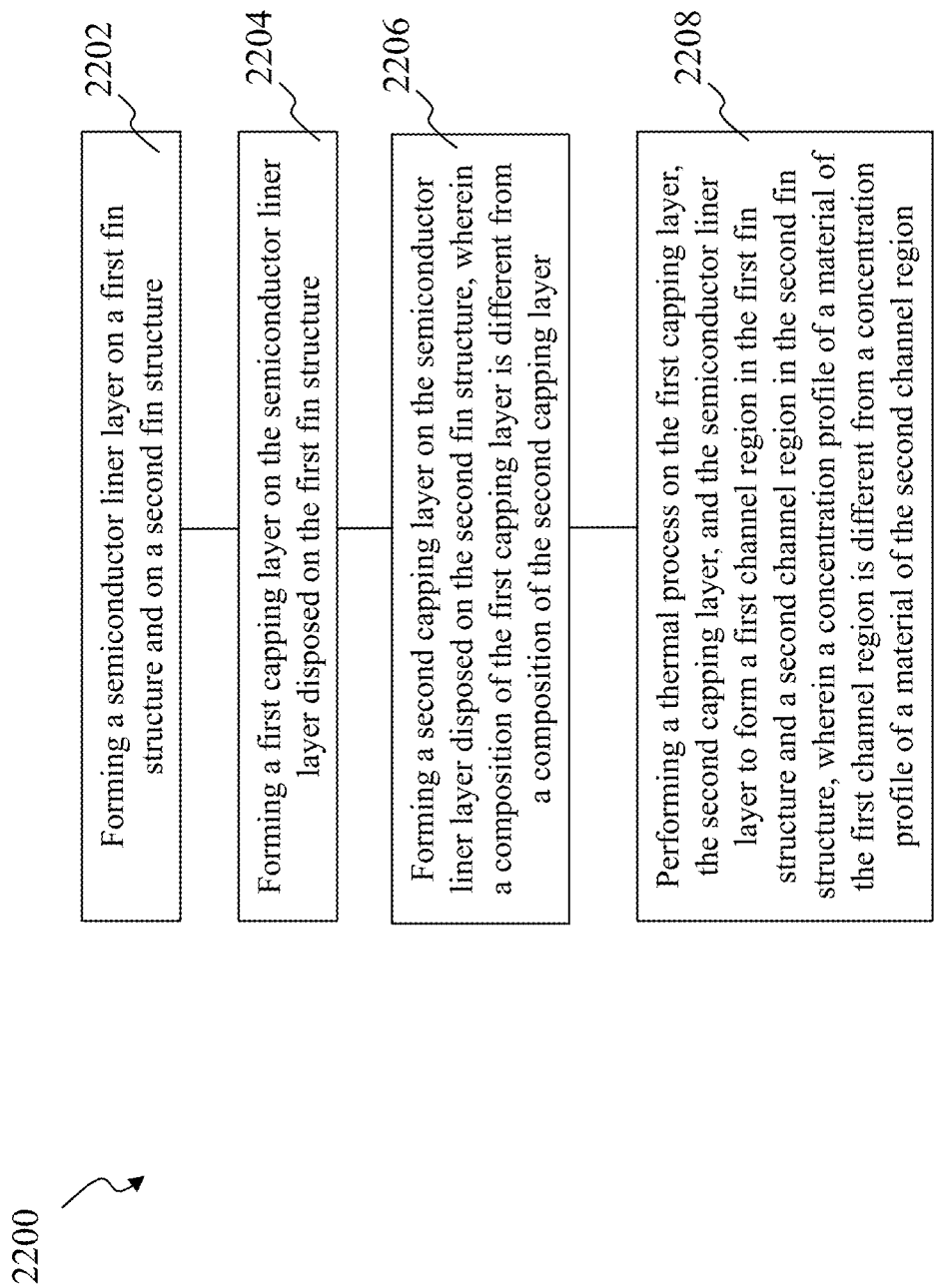

SEMICONDUCTOR DEVICE STRUCTURE HAVING A PLURALITY OF THRESHOLD VOLTAGES AND METHOD OF FORMING THE SAME

PRIORITY DATA

This application is a divisional application of U.S. patent application Ser. No. 16/656,744, filed Oct. 18, 2019, the entirety of which is incorporated herein by reference.

BACKGROUND

The semiconductor integrated circuit (IC) industry has experienced exponential growth. Technological advances in IC materials and designs have produced generations of ICs, with each generation having smaller and more complex circuits than the previous generation. In the course of IC evolution, functional density (e.g., the number of interconnected devices per chip area) has generally increased while geometry size (e.g., the smallest component, or line, that can be created using a fabrication process) has decreased.

Despite advances in materials and fabrication techniques, scaling of planar devices, such as metal-oxide-semiconductor field effect transistor (MOSFET) devices, has proven challenging. To overcome these challenges, non-planar transistors have been developed, examples being gate-all-around (GAA) transistors and fin-like field effect transistors (FinFETs). Advantages of non-planar transistors include reduced short-channel effect, reduced current leakage, and higher current flow. To further improve the performance of such non-planar transistors, there has been a push towards the use of high-mobility channels. As an example, a silicon germanium alloy is a promising channel material because of its high-carrier mobility. In order to meet the requirements of increased functional density and use of high-mobility channels, a semiconductor device structure having a plurality of threshold voltages and methods of forming the same may be needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2 to 16 and 18 to 21 show a process flow illustrating a method of forming a semiconductor device structure having a plurality of threshold voltages, in accordance with an embodiment;

FIG. 22 shows a flow chart describing a method of forming a semiconductor device structure having a plurality of threshold voltages, in accordance with an embodiment.

DETAILED DESCRIPTION

Figure 1:
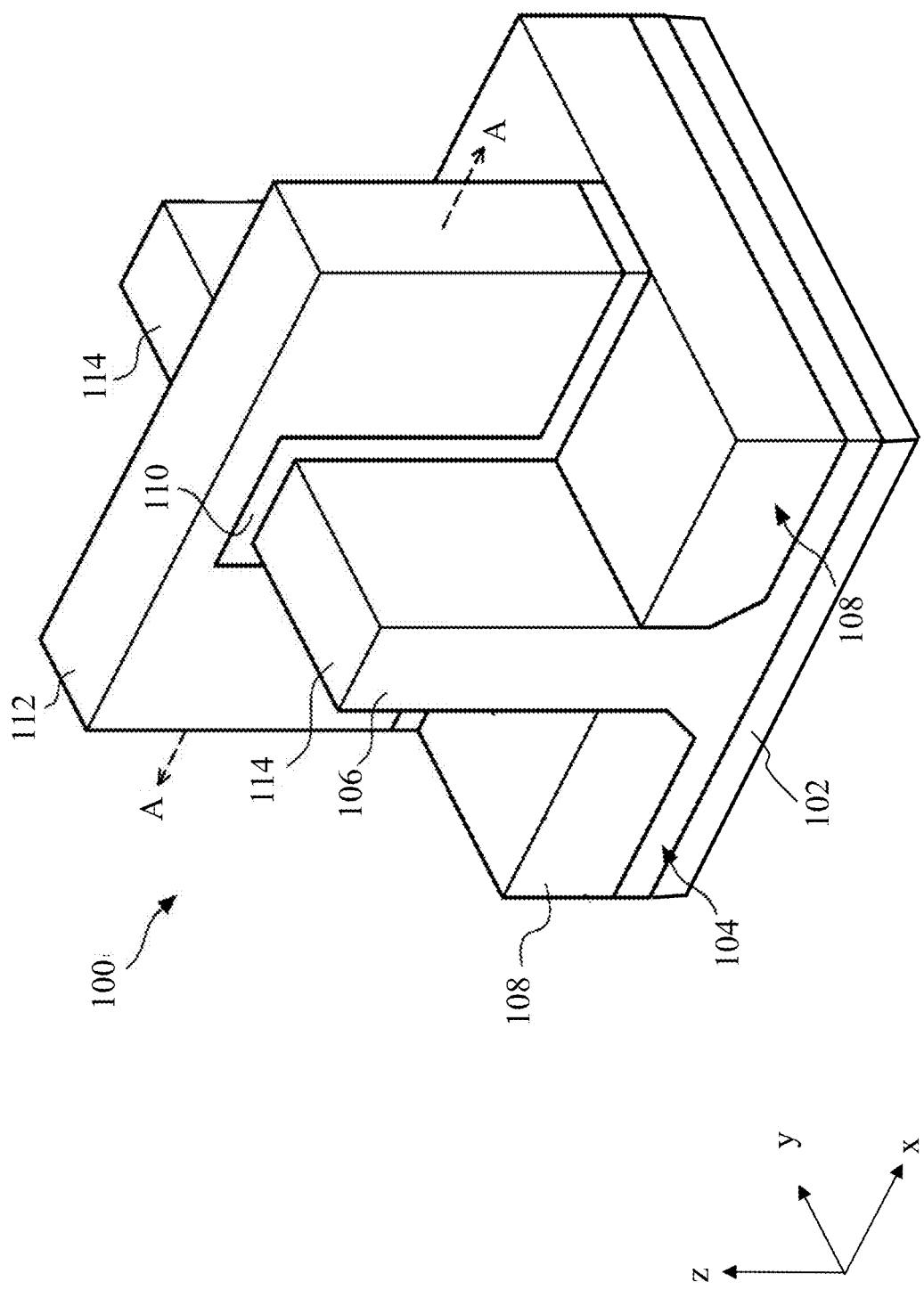
FIG. 1 illustrates a three-dimensional view of a semiconductor device structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to methods for semiconductor device fabrication, and more particularly to methods of forming a semiconductor device structure having a plurality of threshold voltages. The present disclosure proposes forming the semiconductor device structure by at least depositing a semiconductor liner layer (e.g. including silicon germanium (SiGe)) on a first semiconductor structure (e.g. a fin structure) and on a second semiconductor structure (e.g. another fin structure). In various embodiments, the material of the semiconductor liner layer is different from the material of the first and second semiconductor structures. The method proposed in the present disclosure also includes forming a first capping layer to physically contact the semiconductor liner layer overlying the first semiconductor structure and forming a second capping layer to physically contact the semiconductor liner layer overlying the second semiconductor structure. The material of the first capping layer is different from the material of the second capping layer. For example, the first capping layer may include a nitride, while the second capping layer may include an oxide. The method further includes performing a thermal process (e.g. an anneal process) to drive a material (e.g. germanium) of the semiconductor liner layer into the first semiconductor structure and the second semiconductor structure. The drive-in of the material of the semiconductor liner layer may be accomplished by a diffusion process (e.g. a solid phase diffusion process) that is induced, at least in part, by the thermal process. Since the material of the first capping layer is different from the material of the second capping layer, the rate at which the material of the semiconductor liner layer diffuses into the first semiconductor structure is different from the rate at which the material of the semiconductor liner layer diffuses into the second semiconductor structure. This difference in the diffusion rates causes different material distribution profiles (e.g. germanium concentration profiles) in the first semiconductor structure and in the second semiconductor structure. In particular, the first capping layer (e.g. the nitride-containing capping layer) may cause the first semiconductor structure to have a uniform or homogeneous material distribution profile (e.g. germanium concentration profile), while the second capping layer (e.g. the oxide-containing capping layer) may cause the second semiconductor structure to have a gradient material distribution profile (e.g. germanium concentration profile). These differences in the material distribution profiles may be exploited, at least in part, to form a semiconductor device structure having a plurality of threshold voltages. It is noted that a threshold voltage may refer to the value of the gate-source voltage when a conducting channel begins to connect the source and drain regions of the semiconductor device structure, thereby allowing significant current to flow between the source and drain regions. Embodiments of the present disclosure can be easily integrated into existing manufacturing flows, particularly, for complementary metal oxide semiconductor (CMOS) device fabrication. One of ordinary skill may recognize other examples of semiconductor manufacturing flows and devices that may benefit from aspects of the present disclosure.

FIG. 1 illustrates a three-dimensional view of a semiconductor device structure 100, in accordance with an embodiment. In the example of FIG. 1, the semiconductor device structure 100 is a fin-like field effect transistor (FinFET) device. The semiconductor device structure 100 may be fabricated during manufacture or processing of an integrated circuit (IC) device or a portion thereof. The IC device may include, or may be, static random-access memory (SRAM) and/or other logic circuits, passive components such as resistors, capacitors, and inductors, and active components such as P-type field effect transistors (PFETs), N-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations.

The semiconductor device structure 100 includes a substrate 102, a doped region 104, and a fin structure 106 protruding from the doped region 104. Isolation regions 108 are formed over the doped region 104, and the fin structure 106 protrudes from the isolation regions 108 and spatially separates neighboring isolation regions 108. The fin structure 106 includes a channel region, and a gate stack engages the channel region of the fin structure 106. As an example, the gate stack includes a gate dielectric 110 that is disposed along sidewalls and over a top surface of the channel region of the fin structure 106. The gate stack further includes a gate electrode 112 that is disposed over the gate dielectric 110. The fin structure 106 includes source/drain regions 114 that are disposed on opposite sides of the channel region of the fin structure 106. FIG. 1 further illustrates a reference cross-section that is used in later figures. In particular, a cross-section along the line A-A is taken across the channel region of the fin structure 106, and subsequent figures show cross-sectional views along the line A-A in order to illustrate a method of forming a strained channel region in the semiconductor device structure 100.

FIGS. 2 to 16 and 18 to 21 illustrate cross-sectional views, taken along the line A-A, of intermediate stages in the manufacturing a semiconductor device structure or a portion thereof, in accordance with an embodiment. It is noted that while FIG. 1 illustrates a single fin structure 106, the examples shown in FIGS. 2 to 16 and 18 to 21 illustrate multiple fin structures.

Figure 2:
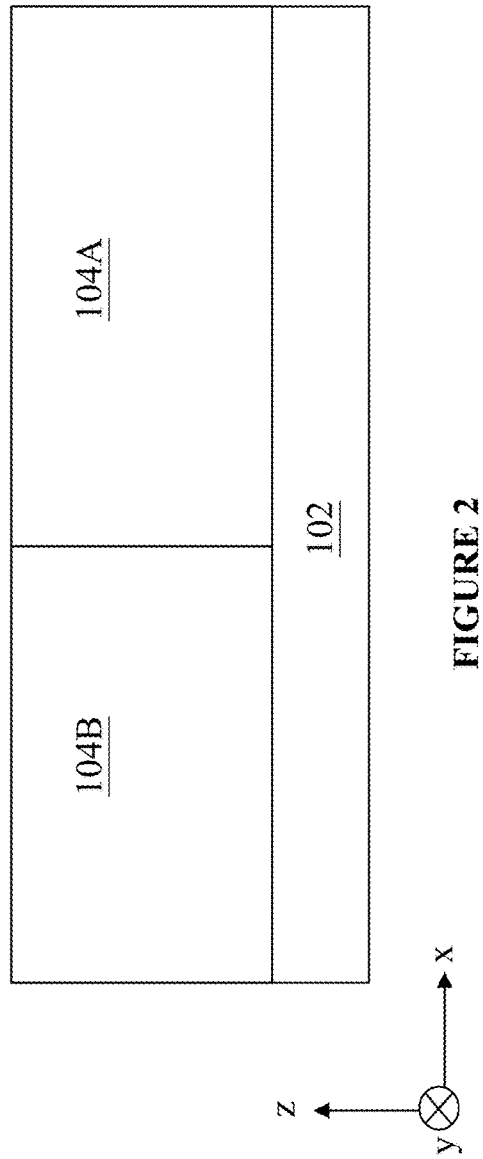

FIG. 2 illustrates a substrate 102. The substrate 102 may include, or may be, an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

The substrate 102 includes various doped regions configured according to design requirements of IC device. For example, the substrate 102 may include N-type doped regions (for example, N-type wells) doped with N-type dopants, such as phosphorus, arsenic, other N-type dopants, or combinations thereof. Additionally, the substrate 102 may include P-type doped regions (for example, P-type wells) doped with P-type dopants, such as boron (for example, $BF_2$), indium, other P-type dopants, or combinations thereof. In the example of FIG. 2, the P-type doped region (e.g. P-well region) is depicted as first region 104A, and the N-type doped region (e.g. N-well region) is depicted as second region 104B. The various doped regions can be formed directly on and/or in the substrate 102, for example, thereby providing a P-well structure, an N-well structure, a dual-well structure, a raised structure, or combinations thereof. The various doped regions may be formed by implantation of dopant atoms, in-situ doped epitaxial growth, a diffusion process, and/or other suitable techniques.

Figure 3:
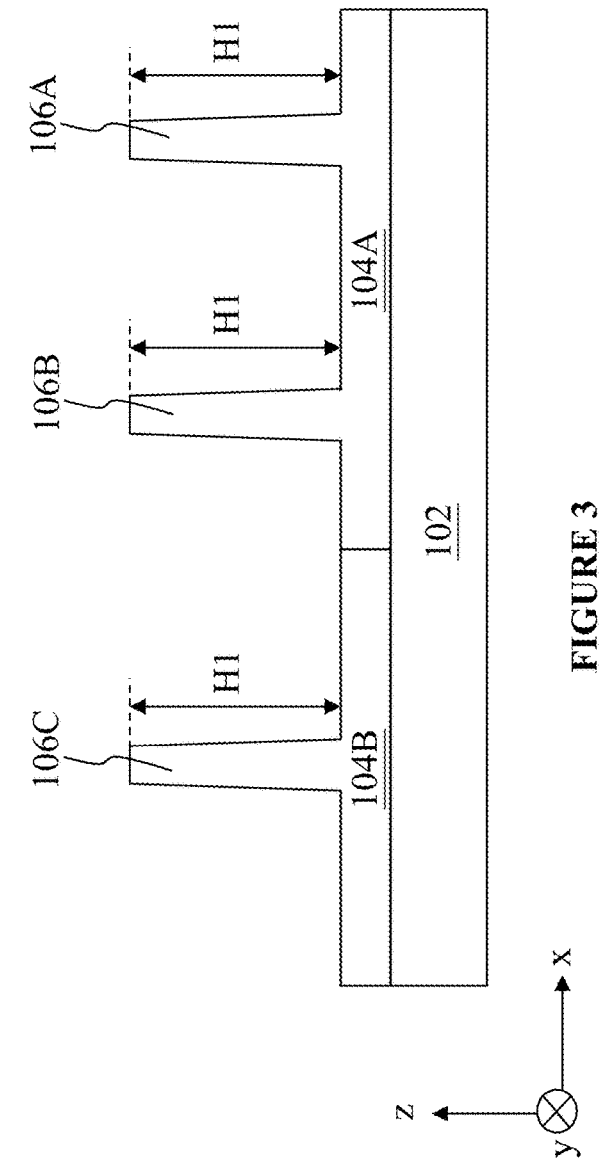

Referring to FIG. 3, a first fin structure 106A and a second fin structure 106B are formed in the first region 104A. Additionally, a third fin structure 106C is formed in the second region 104B. The first fin structure 106A and the second fin structure 106B, being formed in the first well region 104A (e.g. P-well region), may be suitable for providing one or more P-type semiconductor devices. The third fin structure 106C, being formed in the second region 104B (e.g. N-well region), may be suitable for providing one or more N-type semiconductor devices. It is noted that this configuration is for illustrative purposes only and is not intended to be limiting. The fin structures 106A, 106B, 106C may be fabricated using suitable processes, including photolithography and etch processes. The photolithography process may include forming a photoresist layer overlying the first region 104A and the second region 104B, exposing the photoresist layer to a pattern, performing post-exposure bake processes, and developing the photoresist layer to form a masking element (not shown in FIG. 3) including the photoresist layer. The masking element is then used for etching recesses into the first region 104A and the second region 104B, thereby forming fin structures 106A, 106B, 106C. The etching process used to form the fin structures 106A, 106B, 106C may include dry etching, wet etching, reactive ion etching (RIE), and/or other suitable processes.

It is noted that other embodiment methods may be suitable for forming the fin structures 106A, 106B, 106C. For example, the fin structures 106A, 106B, 106C may be patterned using double-patterning or multi-patterning processes. Generally, double-patterning or multi-patterning processes combine photolithography and self-aligned processes, allowing patterns to be created, which patterns have, for example, pitches smaller than what is otherwise obtainable using a single, direct photolithography process. For example, in an embodiment, a sacrificial layer is formed over the first region 104A and the second region 104B, and the sacrificial layer is patterned using a photolithography process. Spacers are formed alongside the patterned sacrificial layer using a self-aligned process. The sacrificial layer is then removed, and the remaining spacers (which may be referred to as "mandrels") may then be used to pattern the fin structures 106A, 106B, 106C. In some embodiments, after its formation, the fin structures 106A, 106B, 106C have a height H1 from about 40 nm to about 70 nm. This height H1 may affect the performance and operation current (Ion) of the semiconductor device structures formed in the first region 104A and the second region 104B. For example, larger heights H1 may provide greater operation current but may be accompanied by speed degradation. Furthermore, larger heights H1 may also be limited by the patterning process.

Referring to FIG. 4, a dielectric liner layer 202 is formed on the sidewalls of the fin structures 106A, 106B, 106C. The dielectric liner layer 202 may include any suitable dielectric material, such as an oxide-containing material, a nitrogen-containing material, a carbon-containing material, or a combination thereof. For example, the dielectric liner layer 202 may include silicon oxide, silicon nitride, silicon carbide (SiC), silicon oxynitride, silicon oxycarbide (SiOC), boron silicate glass (BSG), phosphosilicate glass (PSG), or a combination thereof. In accordance with various examples, the dielectric liner layer 202 has a Young's modulus in a range from about 200 GPa to about 1000 GPa. When the Young's modulus of the dielectric liner layer 202 is within the above-mentioned range, the dielectric liner layer 202 is robust or rigid enough to protect the structural integrity of the fin structures 106A, 106B, 106C as well as the underlying first and second doped regions 104A, 104B, thereby optimizing device performance, especially for advanced technology nodes.

As shown in FIG. 5, a dielectric layer 204 is formed on the dielectric liner layer 202, in accordance with some embodiments. Although the dielectric layer 204 is illustrated in FIG. 5 as being a single-layer structure, in some embodiments the dielectric layer 204 may include a multi-layer structure, for example, having one or more layers containing a dielectric material. In some embodiments, a dielectric material is deposited on the fin structures 106A, 106B, 106C and the dielectric liner layer 202 using, for example, chemical vapor deposition (CVD), plasma-enhanced CVD (PECVD), flowable CVD (FCVD), combinations thereof, or the like. The dielectric material may include silicon oxide, silicon nitride, silicon oxynitride, fluorine-doped silicate glass (FSG), a low-k dielectric material, and/or other suitable insulating material/dielectric material with appropriate fill properties. An anneal process 206 is subsequently performed on the dielectric material. During the anneal process 206, the dielectric material is transformed from liquid-form into solid-form to form the dielectric layer 204. It is noted that the material of the dielectric layer 204 may different from the material of the dielectric liner layer 202.

Figure 6:
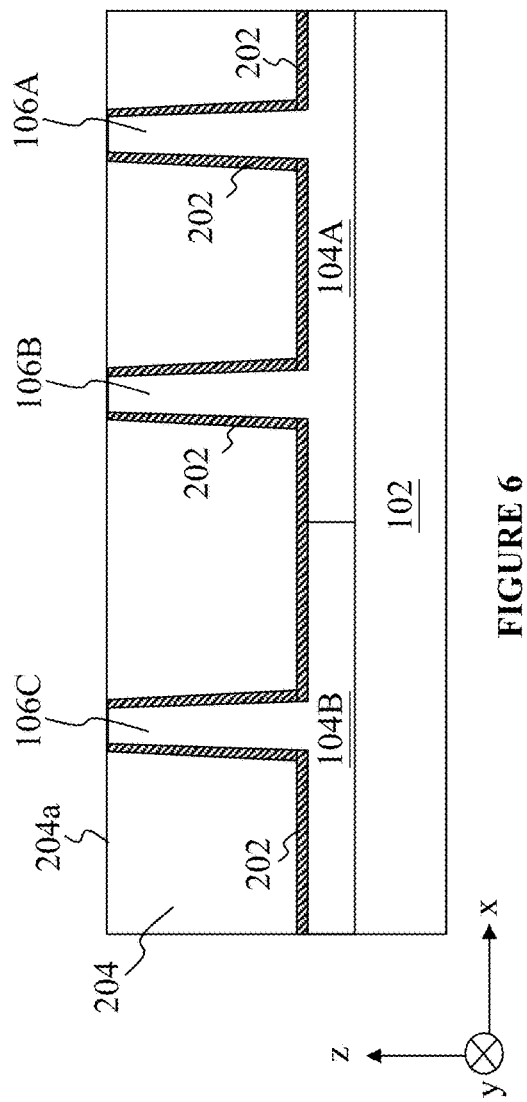
Figure 7:
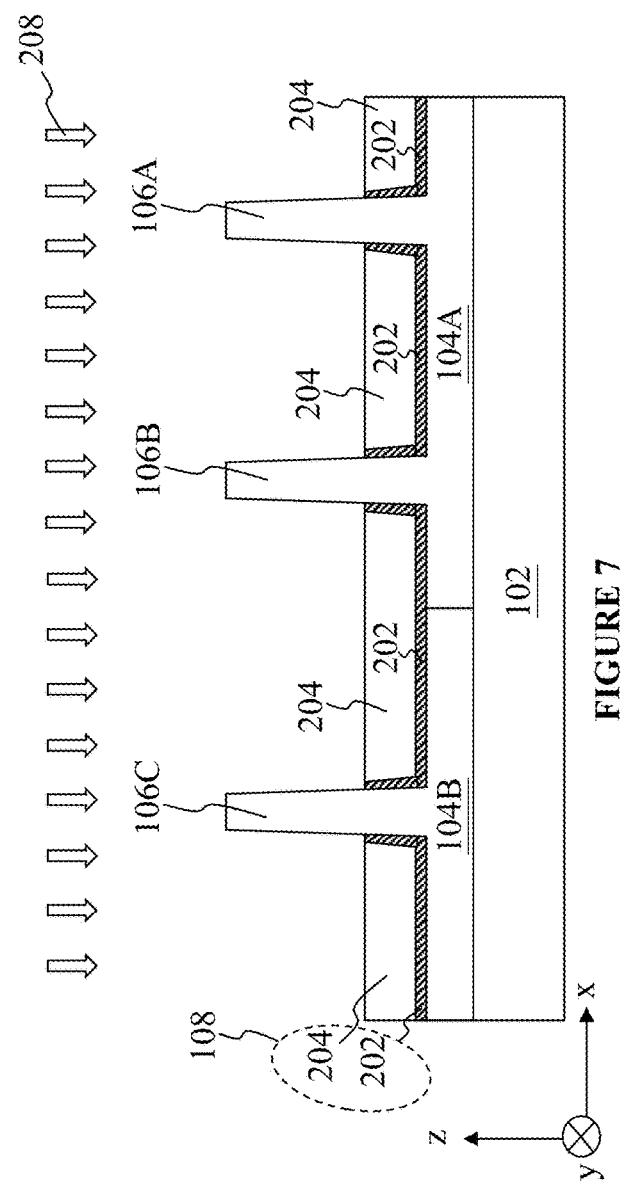

Referring to FIG. 6, the dielectric layer 204 is planarized (e.g. using a chemical-mechanical polishing (CMP)) until a top surface 204a of the dielectric layer 204 is substantially aligned (e.g. substantially co-planar) with top surfaces of the fin structures 106A, 106B, 106C. Following the planarization operation of FIG. 6, portions of the dielectric layer 204 and the dielectric liner layer 202 are removed (e.g. recessed or etched back) to expose upper portions of the fin structures 106A, 106B, 106C, as shown in the example of FIG. 7. As a result, the isolation regions 108 (including the dielectric layer 204 and the dielectric liner layer 202) are formed. In some embodiments, the etch back of the dielectric layer 204 and the dielectric liner layer 202 is accomplished by an etching process 208, such as a dry etching process (e.g. using including ammonia and/or hydrogen fluoride as an etchant) or a wet etching process.

Figure 8:
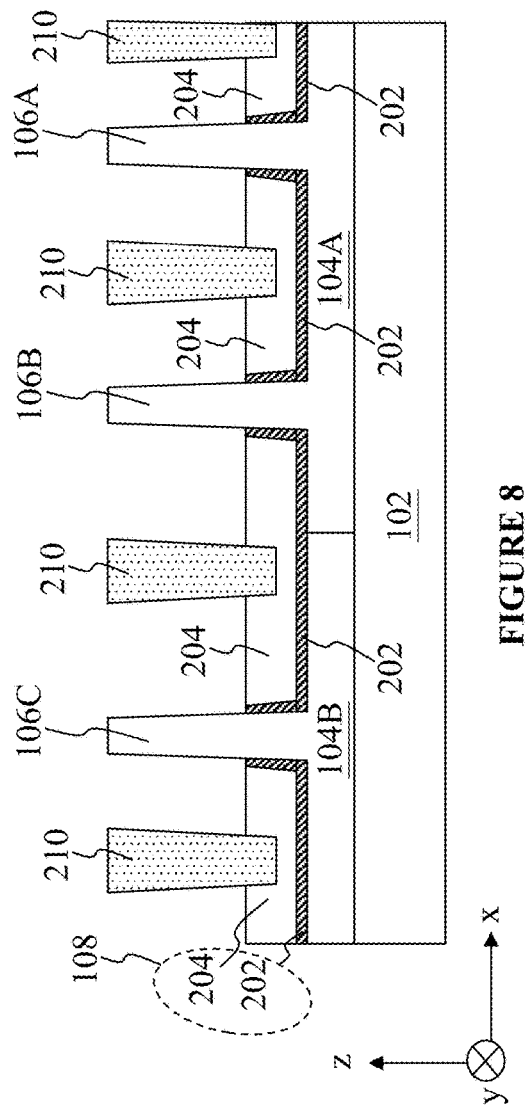

In some embodiments, such as in the example depicted in FIG. 8, dielectric fins 210 (also referred to as "dummy fins" or "hybrid fins," in some instances) may be formed between fin structures 106A, 106B, 106C. Each dielectric fin 210 may be disposed between immediately adjacent fin structures 106A, 106B, 106C and oriented substantially parallel to the fin structures 106A, 106B, 106C. However, unlike the fin structures 106A, 106B, 106C, which are configured to provide active devices, the dielectric fins 210 are inactive and not configured to form semiconductor device structures. In some embodiments, the dielectric fins 210 help to release fin patterning loading effect and prevent source/drain epitaxial bridges. The dielectric fins 210 may be formed by any suitable method. In one example, the dielectric layer 204 is formed as a spacer layer over sidewalls of the fin structures 106A, 106B, 106C. Before etching back the dielectric layer 204 to be lower than the fin structures 106A, 106B, 106C, a second dielectric layer is deposited over sidewalls of the dielectric layer 204. Thereafter, the dielectric layer 204 is recessed (e.g., by a chemical etching process) such that its top surface is lower than both a top surface of the fin structures 106A, 106B, 106C and a top surface of the second dielectric layer, which second dielectric layer forms the dielectric fins 210.

A strained channel in a semiconductor device structure (e.g. a complementary metal oxide semiconductor (CMOS) device) can improve carrier mobility and reduce channel resistance of the device. Additionally, a strain-induced drive current enhancement (due to carrier mobility improvements) can be retained for semiconductor device structures with scaled channel lengths. The materials used in strained channels may be different for P-type semiconductor device structures and N-type semiconductor device structures. By way of example, electron mobility in a N-type semiconductor device structure can be enhanced by inducing tensile stress in channel regions thereof (e.g. by using strained silicon/carbon-doped silicon (Si/Si:C) channels), while hole mobility in a P-type semiconductor device structure can be enhanced with inducing compressive stress in channel regions thereof (e.g. by using silicon germanium (SiGe) channels). The operations that follow provide for a method of forming strained channel regions in the first and second fin structures 106A, 106B (which are used to provide one or more P-type semiconductor device structures), thereby achieving increased carrier mobility and reduced channel resistance. Furthermore, the operations that follow provide for a method of tuning or varying a threshold voltage of the one or more P-type semiconductor device structures.

Figure 9:
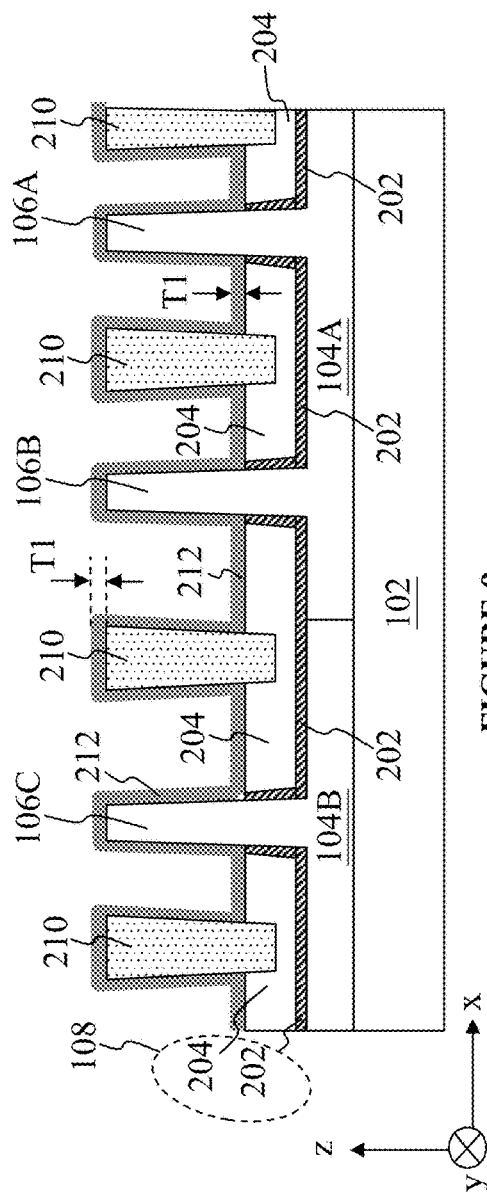
Figure 12:
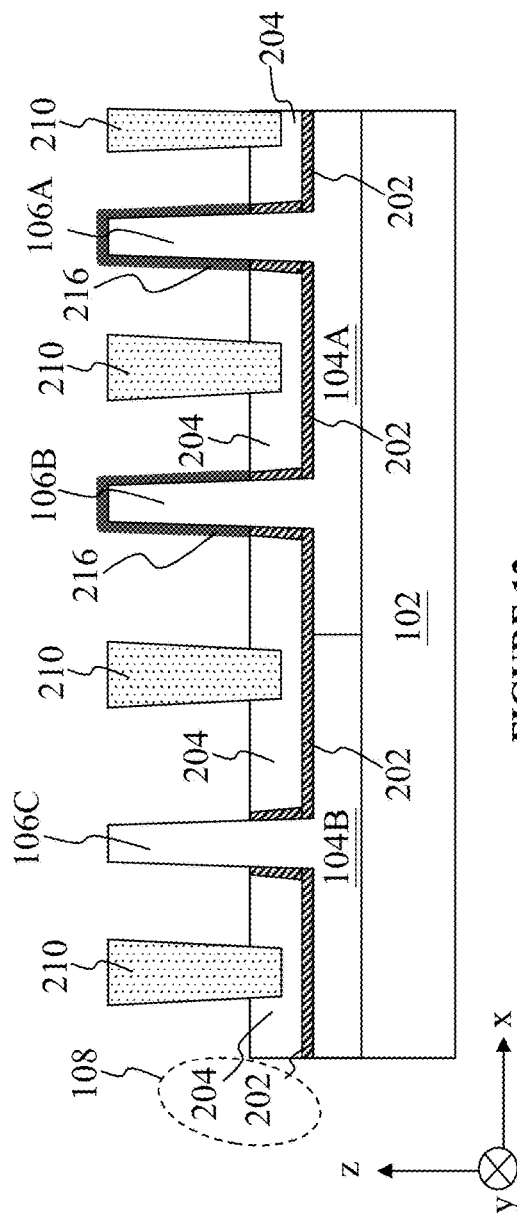

Referring to FIG. 9, a hard mask layer 212 is formed on exposed surfaces of the dielectric layer 204, the dielectric fins 210, and the fin structures 106A, 106B, 106C. The hard mask layer 212 may be a conformal layer, as illustrated in FIG. 9, and may include any suitable dielectric material, such as an oxide and/or a nitride. For example, the hard mask layer 212 may include silicon nitride, silicon carbon oxynitride (SiCON), silicon carbonitride (SiCN), silicon oxide or silicon dioxide ($SiO_2$), aluminum oxide ($Al_2O_3$), hafnium oxide ($HfO_2$), zirconium oxide ($ZrO_2$), combinations thereof, or the like. In some embodiments, the hard mask layer 212 may be formed to have a thickness T1, which may be in a range from about 2 nanometers to about 3 nanometers. The hard mask layer 212 may be formed using CVD, physical vapor deposition (PVD), atomic layer deposition (ALD), chemical oxidation, other suitable processes, or combinations thereof.

Referring to FIG. 10, the hard mask layer 212 is patterned to define a P-type device region 214. In some embodiments, a photoresist layer (or resist) is used to pattern the hard mask layer 212 and define the P-type device region 214. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning. In one embodiment, the resist layer is patterned to leave the portions of the photoresist material disposed over the N-type device regions by the lithography process. After patterning the resist, an etching process is performed to open the hard mask layer 212, thereby transferring the pattern from the resist layer to the hard mask layer 212. The remaining resist layer may be removed after patterning the hard mask layer 212. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less photolithography, electron-beam writing, and ion-beam writing. The etching process to pattern the hard mask layer 212 may include wet etching, dry etching or a combination thereof.

Referring to FIG. 11, a semiconductor liner layer 216 is deposited on exposed surfaces (e.g. on sidewalls and a top surface) of the first fin structure 106A and the second fin structure 106B. In subsequent operations, a material of the semiconductor liner layer 216 is driven into the first fin structure 106A and the second fin structure 106B (e.g. by a thermal process) in order to form strained channel regions in the first fin structure 106A and the second fin structure 106B. The material of the semiconductor liner layer 216 is different from the material of the fin structures 106A, 106B, 106C. In the example shown in FIG. 11, the semiconductor liner layer 216 is formed in the P-type device region 214. Consequently, to enhance hole mobility in the P-type device region 214, compressive stress may be induced in the channel regions of the first fin structure 106A and the second fin structure 106B. In order to achieve such an effect, the semiconductor liner layer 216 may include, or may be, silicon germanium (SiGe). In embodiments where the semiconductor liner layer 216 includes SiGe, the concentration of germanium, expressed as atomic percentage, may be in a range from about 25% to about 65% (e.g. about 55%). In some embodiments, the semiconductor liner layer 216 may have a thickness T2, which may be in a range from about 1 nanometer to about 4 nanometers (e.g. about 2.5 nanometers). The semiconductor liner layer 216 may be a conformal layer, as in the example of FIG. 11. The semiconductor liner layer 216 may be deposited using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. Following the deposition of the semiconductor liner layer 216, the hard mask layer 212 is removed using, for example, an etching process to form the intermediate structure shown in FIG. 12. The etching process used to remove the hard mask layer 212 may include a dry etching process (for example, a reactive ion etching (RIE) process), a wet etching process, other suitable etching process, or combinations thereof.

Figure 13:
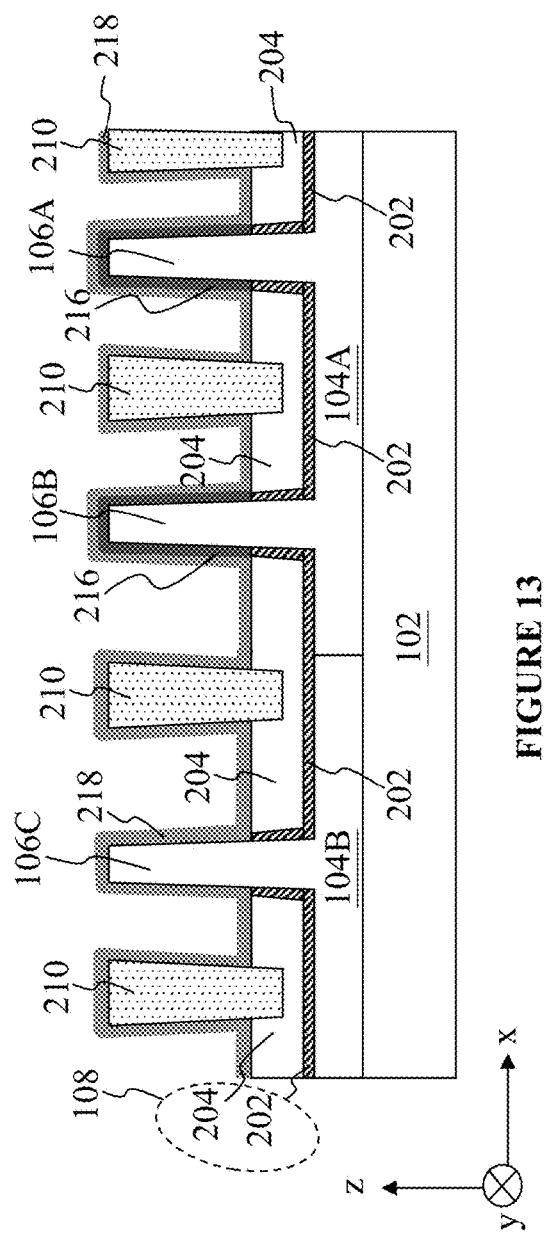
Figure 14:
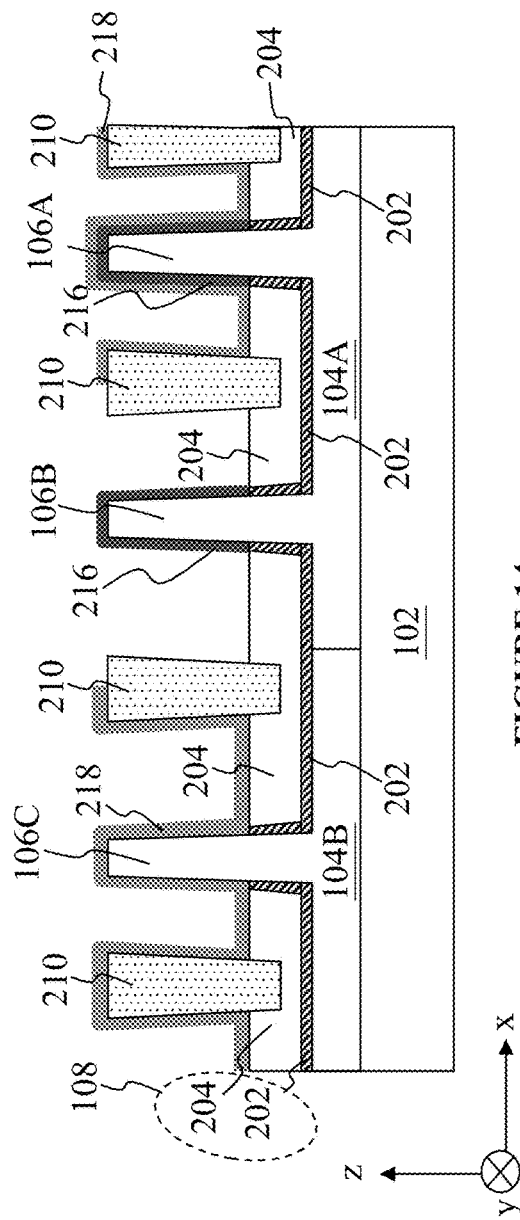

In the operation shown in FIG. 13, a first capping layer 218 is formed on exposed surfaces of the dielectric layer 204, the dielectric fins 210, the third fin structure 106C, and the semiconductor liner layer 216. A suitable deposition process may be used, examples being CVD, PVD, ALD, chemical oxidation, other suitable processes, or combinations thereof. The first capping layer 218 may include a nitride. For example, the first capping layer 218 may include silicon nitride, silicon carbon oxynitride (SiCON), silicon carbonitride (SiCN), combinations thereof, or the like. In FIG. 14, the first capping layer 218 is patterned to remove the first capping layer 218 overlying the second fin structure 106B. The patterning of the first capping layer 218 may be accomplished using the lithography process described above in reference to FIG. 10.

Figure 15:
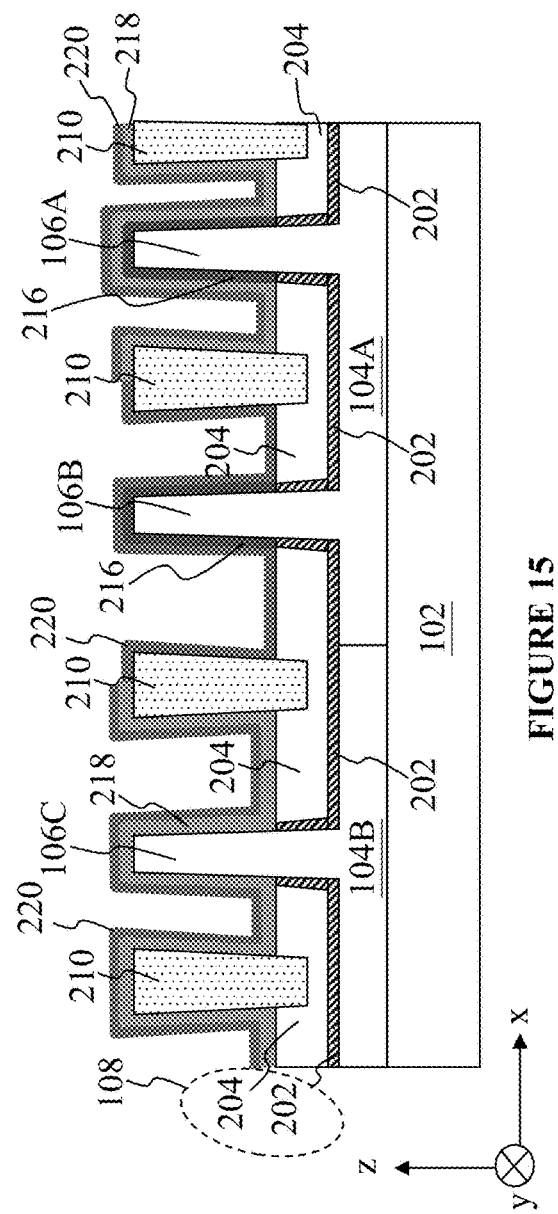

Referring to FIG. 15, a second capping layer 220 is deposited on the intermediate structure of FIG. 14. For example, the second capping layer 220 is formed on exposed surfaces of the first capping layer 218, the dielectric layer 204, the dielectric fins 210, and the semiconductor liner layer 216. A suitable deposition process may be used, examples being CVD, PVD, ALD, chemical oxidation, other suitable processes, or combinations thereof. The second capping layer 220 may be a material that is different from the first capping layer 218. For example, the second capping layer 220 may include an oxide, examples being silicon oxide or silicon dioxide ($SiO_2$), aluminum oxide ($Al_2O_3$), hafnium oxide ($HfO_2$), zirconium oxide ($ZrO_2$), combinations thereof, or the like, combinations thereof, or the like. As a result of the operations shown in FIGS. 12 to 15, the semiconductor liner layer 216 overlying the second fin structure 106B is in physical contact with the second capping layer 220 (e.g. the oxide-containing capping layer), while the semiconductor liner layer 216 overlying the first fin structure 106A is in physical contact with the first capping layer 218 (e.g. the nitride-containing capping layer).

Figure 16:
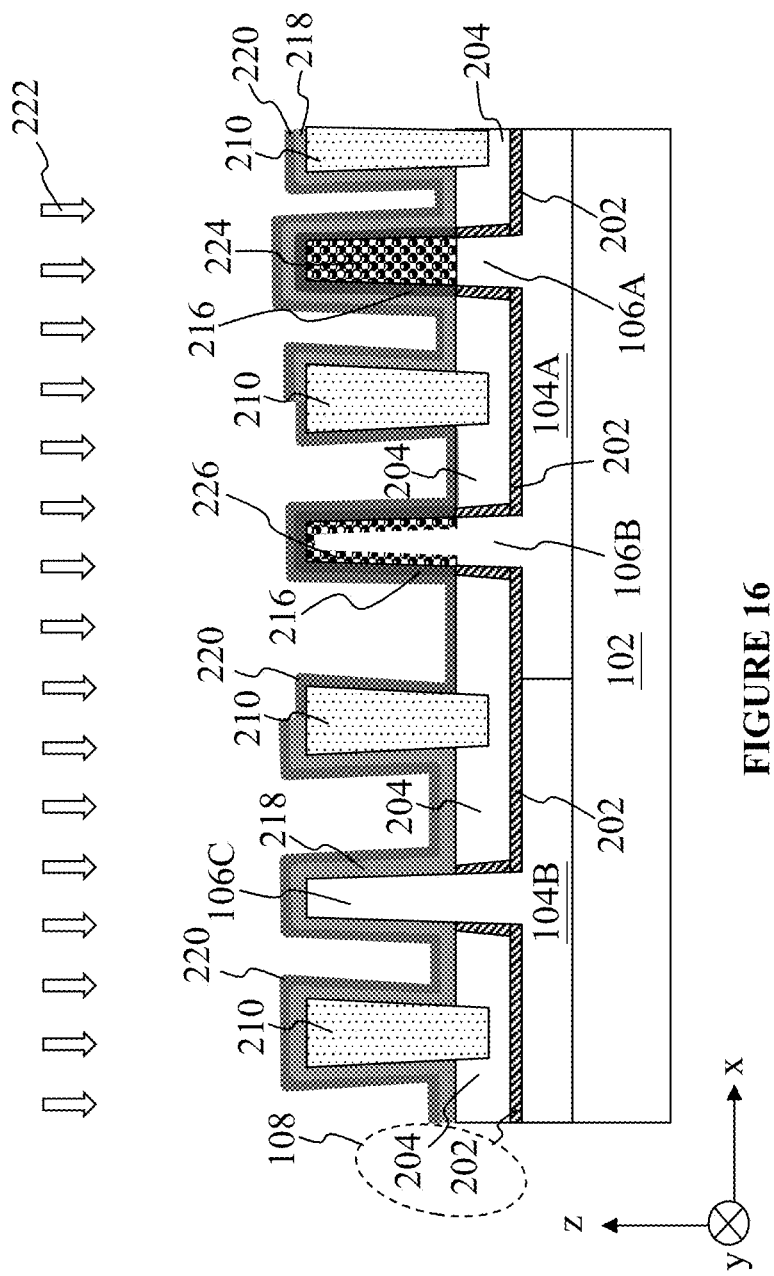

In FIG. 16, a thermal process 222 is performed to cause diffusion (e.g. solid phase diffusion) of a material of the semiconductor liner layer 216 into the first fin structure 106A and the second fin structure 106B. The thermal process 222 may be performed at a temperature in a range from about 900 degrees Celsius to about 1100 degrees Celsius. A duration of the thermal process 222 may be in a range from about 10 seconds to about 60 seconds. The first and second capping layers 218, 220 prevent oxidation of the semiconductor liner layer 216 during the thermal process 222. The first and second capping layers 218, 220 also prevent or substantially reduce out-diffusion of the material of the semiconductor liner layer 216 into the environment surrounding the intermediate structure shown in FIG. 16. The first and second capping layers 218, 220 aid in driving the material of the semiconductor liner layer 216 into the first fin structure 106A and the second fin structure 106B. Furthermore, since the material of the first capping layer 218 is different from the material of the second capping layer 220, the rate at which the material of the semiconductor liner layer 216 diffuses into the first fin structure 106A is different from the rate at which the material of the semiconductor liner layer 216 diffuses into the second fin structure 106B.

In the examples described above, the semiconductor liner layer 216 overlying the second fin structure 106B is in physical contact with the second capping layer 220 (e.g. including an oxide), while the semiconductor liner layer 216 overlying the first fin structure 106A is in physical contact with the first capping layer 218 (e.g. including a nitride). Generally, for the same temperature and duration, a nitride-containing capping layer causes a faster thermal drive-in of the material of the semiconductor liner layer 216 compared to an oxide-containing capping layer. Consequently, the material of the semiconductor liner layer 216 overlying the first fin structure 106A diffuses into the first fin structure 106A at a faster rate than the material of the semiconductor liner layer 216 overlying the second fin structure 106B. As a result, the thermal process 222 forms a first strained channel region 224 in the first fin structure 106A and a second strained channel region 226 in the second fin structure 106B, where the first strained channel region 224 has a uniform or homogeneous distribution profile and the second strained channel region 226 has a gradient distribution profile. The distribution profiles of the first fin structure 106A and the second fin structure 106B are shown in greater detail in FIGS. 17A and 17B.

Figure 17A:
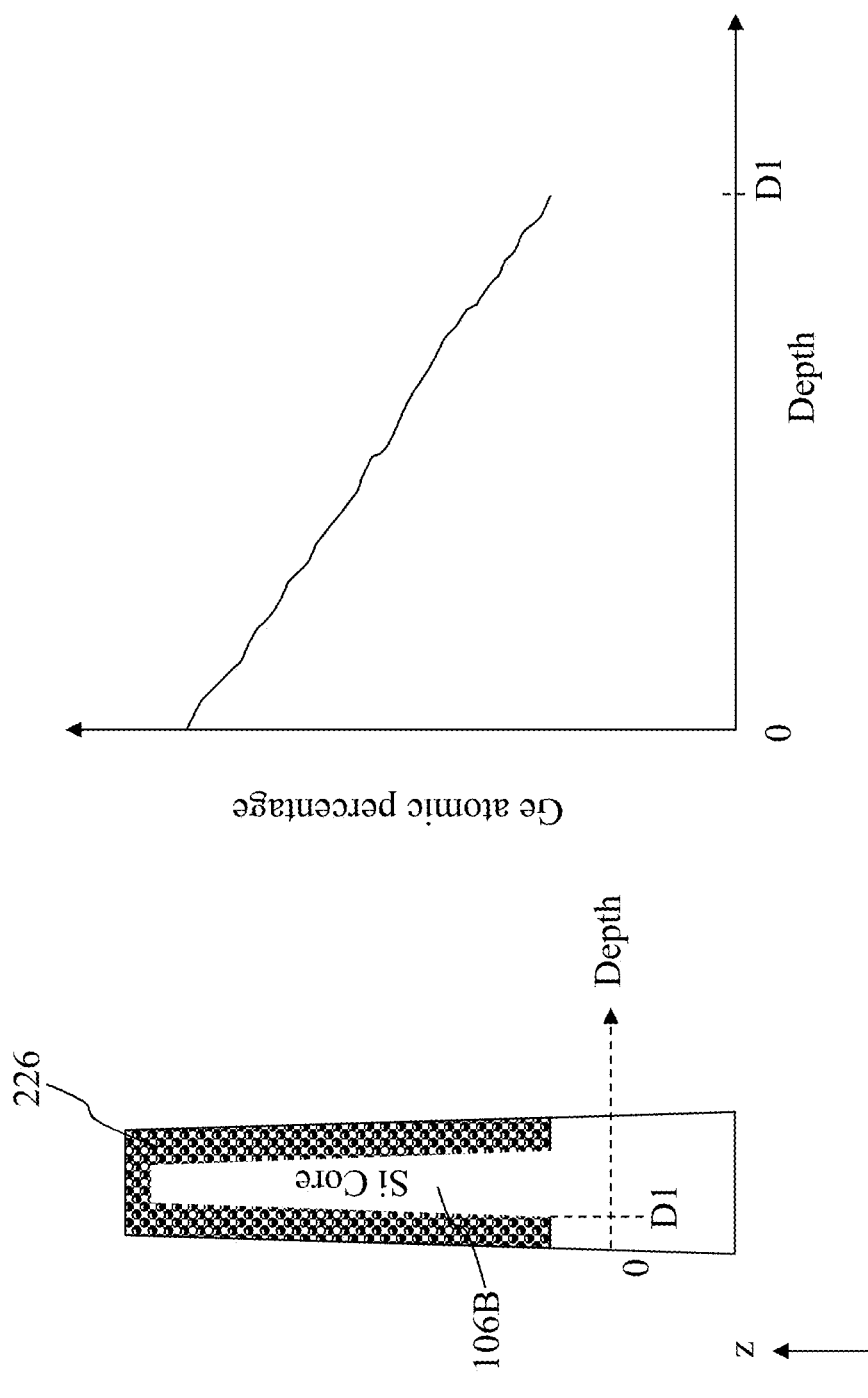
FIGS. 17A and 17B show zoomed-in views of fin structures and strained channel regions formed therein, as well as concentration profile of germanium as a function of depth, in accordance with an embodiment.

FIG. 17A shows a zoomed-in view of the second fin structure 106B and the second strained channel region 226 formed therein. FIG. 17A also shows the variation of the atomic percentage of germanium as a function of depth for embodiments where the semiconductor liner layer 216 includes silicon germanium and where germanium atoms of the semiconductor liner layer 216 are driven into the second fin structure 106B as a result of the thermal process 222. In the example shown in FIG. 17A, depth is measured in the x-direction. As seen in FIG. 17A, the germanium concentration exhibits a gradient distribution profile (e.g. a substantially linear germanium concentration profile). In the example of FIG. 17A, adjacent portions of the second strained channel region 226 are separated by a central Si core due to the slower diffusion of germanium atoms into the material of the second fin structure 106B. In some embodiments, the concentration of germanium, expressed as atomic percentage, can vary from about 35% (e.g. where depth=0) to about 10% (e.g. where depth=D1, where D1 is the diffusion depth). In some examples, the diffusion depth D1 may be in a range from about 1 nanometer to about 2 nanometers. A diffusion depth D1 within the stated range of values may be needed for device performance (e.g. to meet transistor switching speed requirements), especially for advanced technology nodes.

Figure 17B:
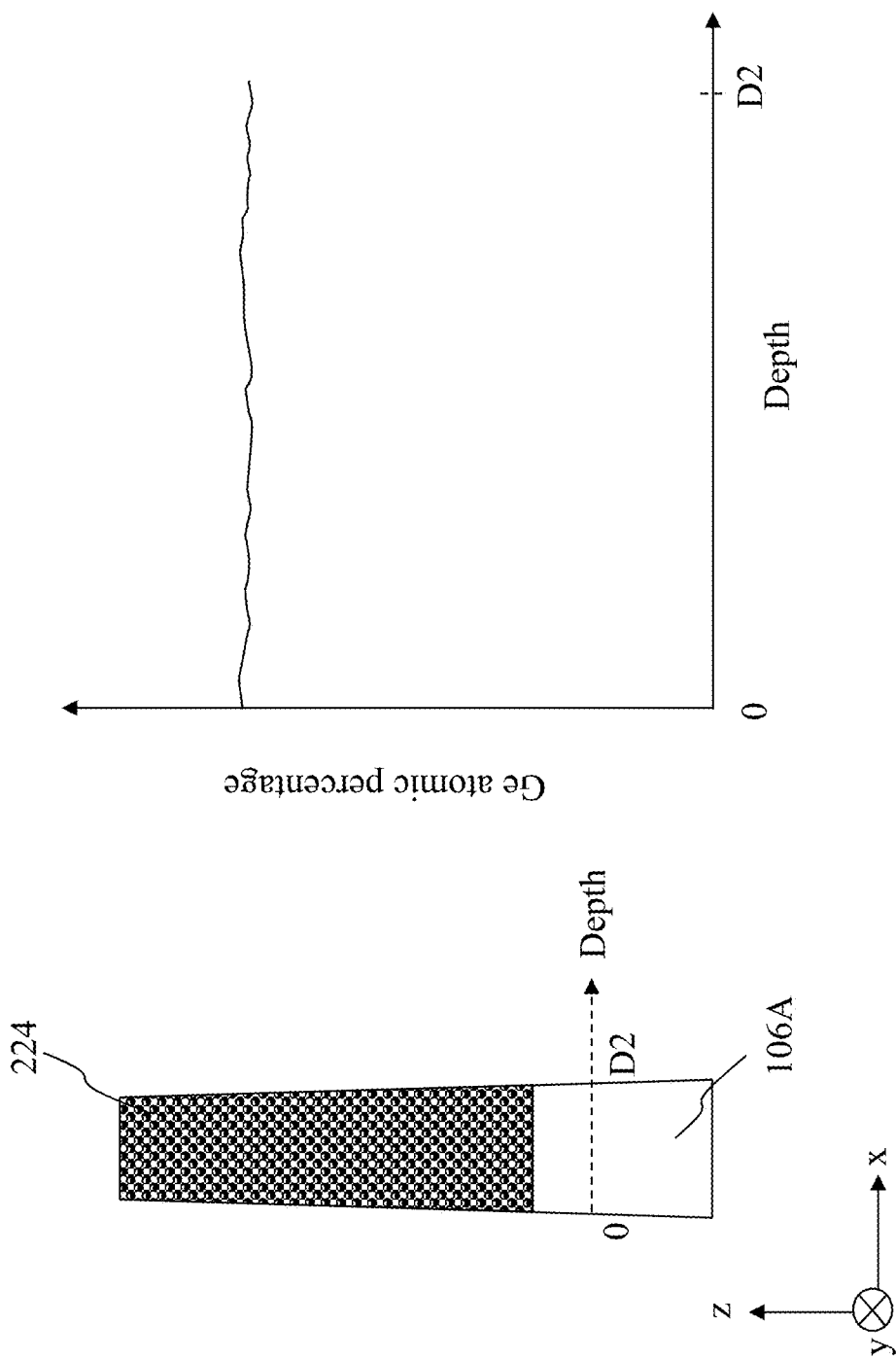

FIG. 17B shows a zoomed-in view of the first fin structure 106A and the first strained channel region 224 formed therein. FIG. 17B also shows the variation of the atomic percentage of germanium as a function of depth for embodiments where the semiconductor liner layer 216 includes silicon germanium and where germanium atoms of the semiconductor liner layer 216 are driven into the first fin structure 106A as a result of the thermal process 222. In the example shown in FIG. 17B, depth is also measured in the x-direction. As seen in FIG. 17B, the germanium concentration exhibits a uniform or homogeneous distribution profile due to the faster diffusion of germanium atoms into the material of the first fin structure 106A. In some embodiments, the concentration of germanium, expressed as atomic percentage may be in a range from about 20% to about 35%. A germanium concentration within the stated range of values may be needed for device performance (e e.g. to meet transistor switching speed requirements), especially for advanced technology nodes.

Figure 18:
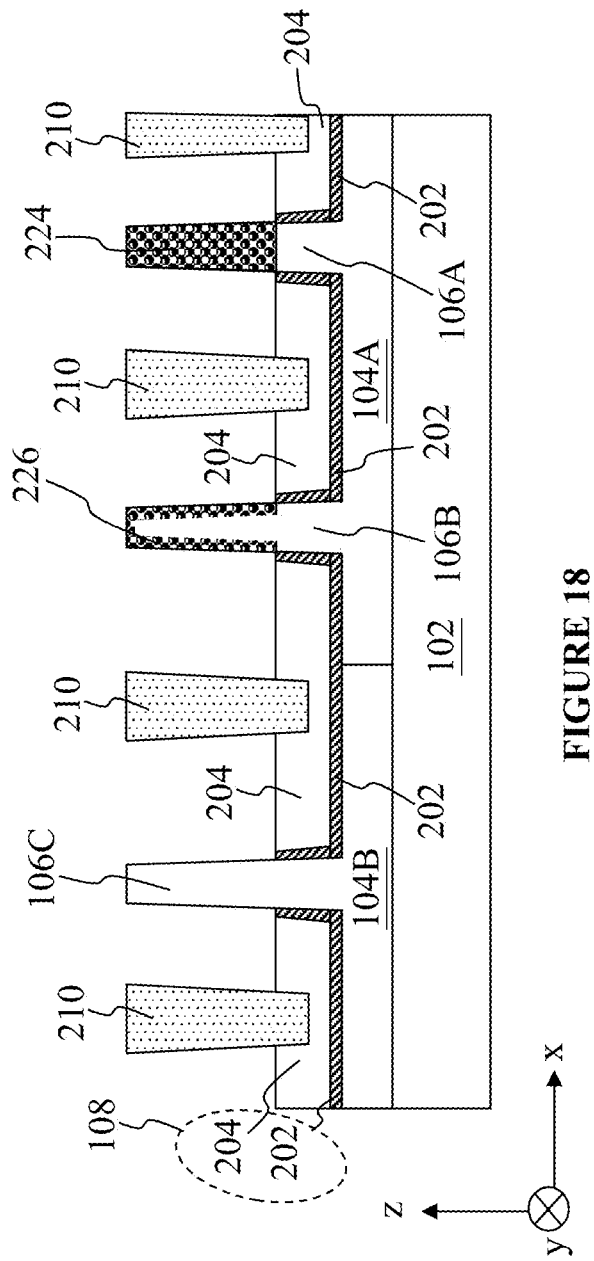

Referring to FIG. 18, the first capping layer 218, the second capping layer 220, and the semiconductor liner layer 216 are removed using, for example, an etching process, which may include a dry etching process (for example, a reactive ion etching (RIE) process), a wet etching process, other suitable etching process, or combinations thereof.

Figure 19:
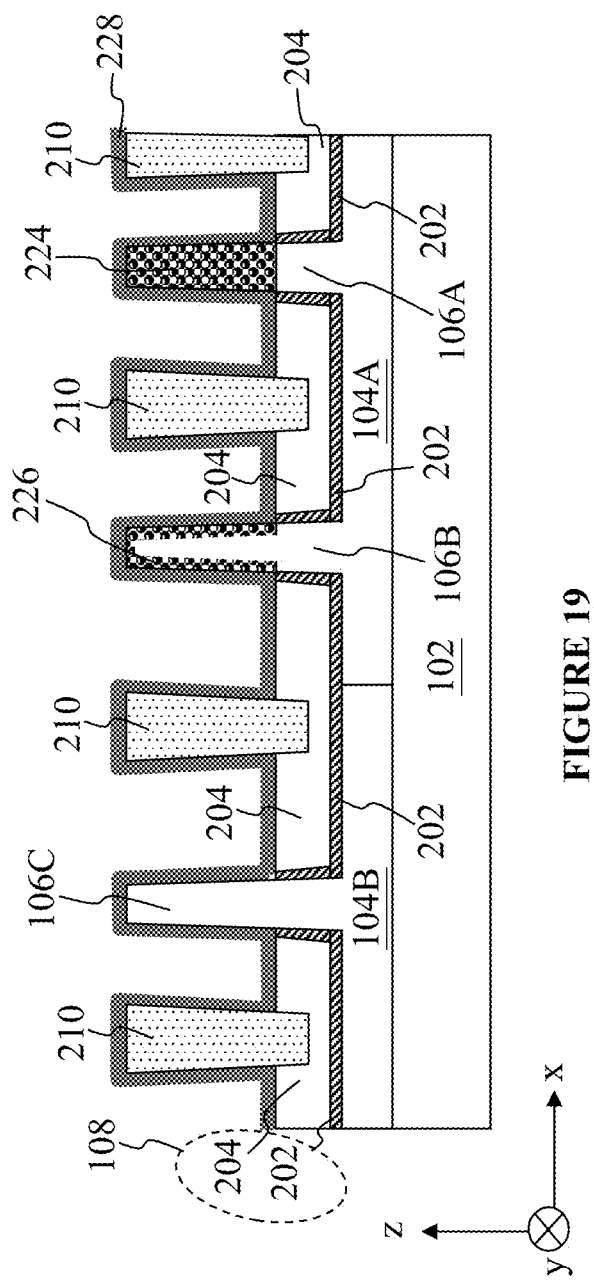

In the operation depicted in FIG. 19, a gate dielectric layer 228 is formed over the intermediate structure shown in FIG. 18. The gate dielectric layer 228 may include a high-k dielectric material (e.g. k>7.0), examples being metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate dielectric layer 228 may be formed by a suitable technique, such as ALD, CVD, metal-organic CVD (MOCVD), PVD, thermal oxidation, combinations thereof, and/or other suitable techniques.

Figure 20:
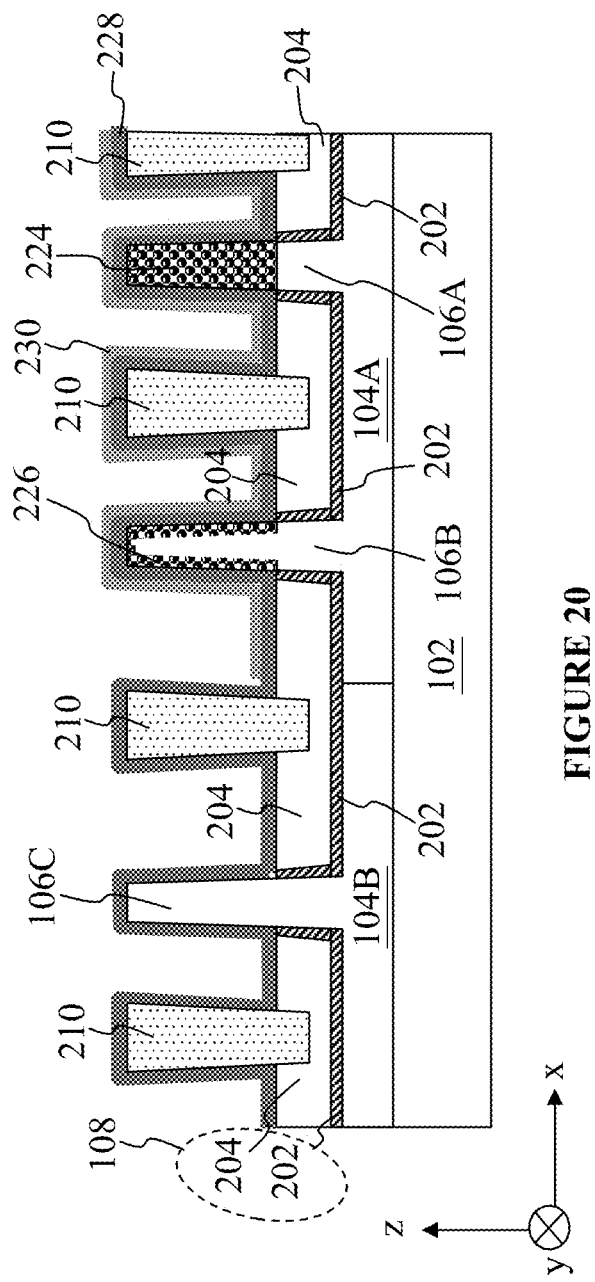

In FIG. 20, a work function layer 230 may be formed in the P-type device region 214. The work function layer 230 may include a material having a work function of about 5.2 eV or higher, examples being TiN, TaN, Ru, Mo, Al, W, WCN, TiSiN (TSN), TiAlC, WN, $ZrSi_2$, $MoSi_2$, $TaSi_2$, $NiSi_2$, WN, other suitable P-type work function materials, or a combination thereof. The work function layer 230 may be deposited by a suitable technique, such as PVD. In some embodiments, an N-type work function layer (not shown in FIG. 20 for the sake of simplicity) may be formed over the first fin structure 106A. In such embodiments, the N-type work function layer may include Ti, Ag, TaAl, TaAlC, TiAlN, TaC, TaCN, TaSiN, Mn, Zr, other suitable N-type work function materials, or a combination thereof.

Figure 21:
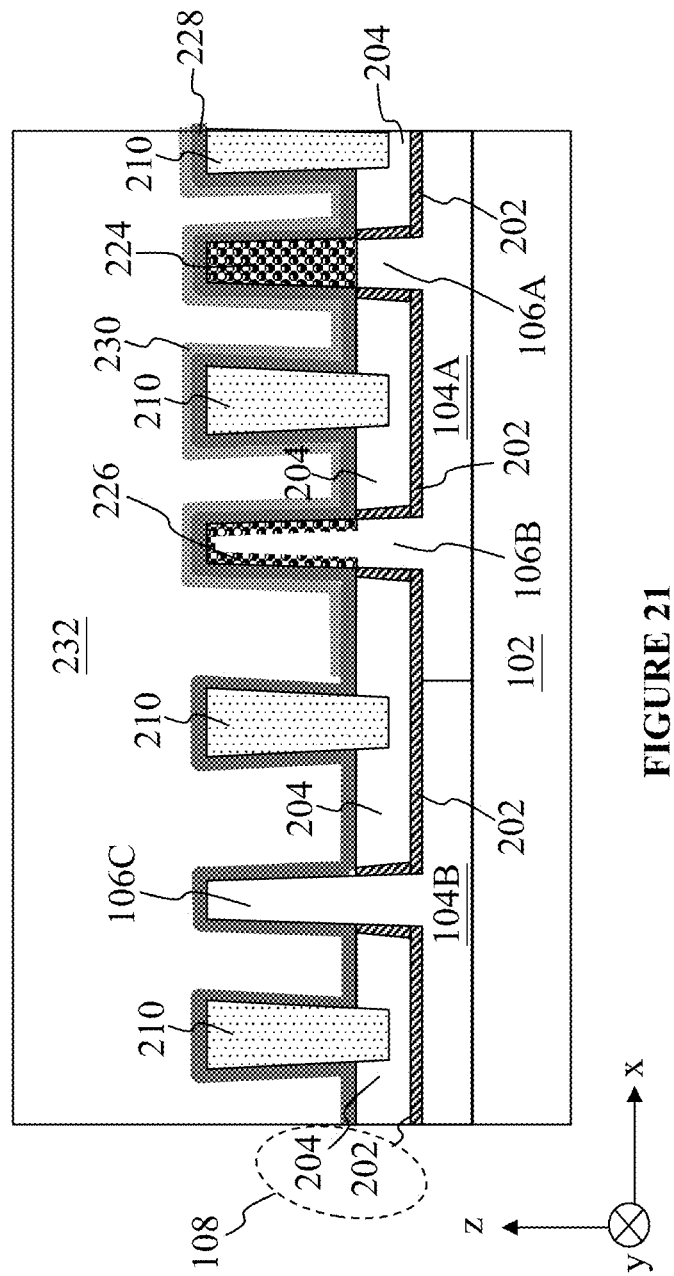

Referring to FIG. 21, a gate electrode layer 232 may be formed over the work function layer 230 in the P-type device region 214 and the gate dielectric layer 228. The gate electrode layer 232 may include a metal-containing material such as TiN, TaN, TaC, Co, Ru, Al, combinations thereof, or multi-layers thereof, and may be formed by, e.g., electroplating, electroless plating, or other suitable method. Even though the same work function layer 230 is used for the first fin structure 106A and the second fin structure 106B, the different material distribution profiles of the strained channel regions 224 and 226 cause the threshold voltage associated with the first fin structure 106A to be different from the threshold voltage associated with the second fin structure 106B, thereby resulting in a semiconductor device structure having a plurality of threshold voltages.

In comparison with current techniques, the process flow depicted in FIGS. 2 to 16 and 18 to 21 forms a semiconductor device structure having a plurality of threshold voltages by varying the material of a capping layer, thereby varying the diffusion rate of a material (e.g. germanium) of the semiconductor liner layer 216, which in turn results in varying material distribution profiles (e.g. germanium concentration profiles). The proposed method also results in vertical fin profiles for the first, second, and third fin structures 106A, 106B, 106C. Furthermore, threshold voltage of each of the first, second, and third fin structures 106A, 106B, 106C may be further tuned through the use of a suitable work function layer (e.g. N-type work function layer for third fin structure 106C and P-type work function layer for first and second fin structures 106A, 106B).

FIG. 22 shows a flow chart describing a method 2200 of forming a semiconductor device structure having a plurality of threshold voltages. The method 2200 includes step 2202 of forming semiconductor liner layer 216 on a first fin structure (e.g. fin structure 106A) and on a second fin structure (e.g. fin structure 106B). Step 2202 may, as an example, correspond to the operations described above in reference to FIGS. 9 to 12. The method 2200 additionally includes step 2204 of forming first capping layer 218 on the semiconductor liner layer 216 disposed on the first fin structure (e.g. fin structure 106A). Step 2204 may, as an example, correspond to the operations described above in reference to FIGS. 13 and 14. The method 2200 further includes step 2206 of forming a second capping layer 220 on the semiconductor liner layer 216 disposed on the second fin structure (e.g. fin structure 106B), wherein a composition of the first capping layer 218 is different from a composition of the second capping layer 220. Step 2206 may, as an example, correspond to the operations described above in reference to FIG. 15. The method 2200 includes step 2208 of performing a thermal process 222 on the first capping layer 218, the second capping layer 220, and the semiconductor liner layer 216 to form a first channel region (e.g. channel region 224) in the first fin structure (e.g. fin structure 106A) and a second channel region (e.g. channel region 226) in the second fin structure (e.g. fin structure 106B), wherein a concentration profile of a material the first channel region is different from a concentration profile of a material the second channel region. Step 2208 may, as an example correspond to the operations described above in reference to FIG. 16.

In summary, the present disclosure is generally related to methods for semiconductor device fabrication, and more particularly to methods of forming a semiconductor device structure having a plurality of threshold voltages. The present disclosure proposes forming the semiconductor device structure by at least depositing a semiconductor liner layer 216 (e.g. including silicon germanium (SiGe)) on a first semiconductor structure (e.g. fin structure 106A) and on a second semiconductor structure (e.g. fin structure 106B). In various embodiments, the material of the semiconductor liner layer 216 is different from the material of the first and second semiconductor structures. The method proposed in the present disclosure also includes forming a first capping layer 218 to physically contact the semiconductor liner layer 216 overlying the first semiconductor structure (e.g. fin structure 106A) and forming a second capping layer 220 to physically contact the semiconductor liner layer 216 overlying the second semiconductor structure (e.g. fin structure 106B). The material of the first capping layer 218 is different from the material of the second capping layer 220. For example, the first capping layer 218 may include a nitride, while the second capping layer 220 may include an oxide. The method further includes performing a thermal process (e.g. an anneal process) to drive a material (e.g. germanium) of the semiconductor liner layer 216 into the first semiconductor structure (e.g. fin structure 106A) and the second semiconductor structure (e.g. fin structure 106B). The drive-in of the material of the semiconductor liner layer may be accomplished by a diffusion process (e.g. a solid phase diffusion process) that is induced, at least in part, by the thermal process. Since the material of the first capping layer 218 is different from the material of the second capping layer 220, the rate at which the material of the semiconductor liner layer 216 diffuses into the first semiconductor structure (e.g. fin structure 106A) is different from the rate at which the material of the semiconductor liner layer 216 diffuses into the second semiconductor structure (e.g. fin structure 106B). This difference in the diffusion rates causes different material distribution profiles (e.g. germanium concentration profiles) in the first semiconductor structure (e.g. fin structure 106A) and in the second semiconductor structure (e.g. fin structure 106B). In particular, the first capping layer 218 (e.g. the nitride-containing capping layer) may cause the first semiconductor structure (e.g. fin structure 106A) to have a uniform or homogeneous material distribution profile (e.g. germanium concentration profile), while the second capping layer 220 (e.g. the oxide-containing capping layer) may cause the second semiconductor structure (e.g. fin structure 106B) to have a gradient material distribution profile (e.g. germanium concentration profile). These differences in the material distribution profiles may be exploited, at least in part, to form a semiconductor device structure having a plurality of threshold voltages. Embodiments of the present disclosure can be easily integrated into existing manufacturing flows, particularly, for complementary metal oxide semiconductor (CMOS) device fabrication. One of ordinary skill may recognize other examples of semiconductor manufacturing flows and devices that may benefit from aspects of the present disclosure.

An embodiment method includes: forming a semiconductor liner layer on a first fin structure and on a second fin structure; forming a first capping layer on the semiconductor liner layer disposed on the first fin structure; forming a second capping layer on the semiconductor liner layer disposed on the second fin structure, wherein a composition of the first capping layer is different from a composition of the second capping layer; and performing a thermal process on the first capping layer, the second capping layer, and the semiconductor liner layer to form a first channel region in the first fin structure and a second channel region in the second fin structure, wherein a concentration profile of a material of the first channel region is different from a concentration profile of a material of the second channel region.

An embodiment method includes: providing a semiconductor structure including a first region having a first conductivity type and a second region having a second conductivity type different from the first conductivity type, the first region including a first fin structure and a second fin structure, the second region including a third fin structure; forming a semiconductor liner layer on the first fin structure and on the second fin structure; forming a nitride-containing capping layer on the semiconductor liner layer disposed on the first fin structure; forming an oxide-containing capping layer on the semiconductor liner layer disposed on the second fin structure; and annealing the oxide-containing capping layer and the nitride-containing capping layer, the annealing forming a first material concentration profile in the first fin structure and a second material concentration profile in the second fin structure, the first material concentration profile being different from the second material concentration profile.

An embodiment device includes: a p-well region; a first fin structure and a second fin structure protruding from the p-well region; an n-well region; a third fin structure protruding from the n-well region; a first strained channel region in the first fin structure, the first strained channel region having a first material concentration profile; and a second strained channel region in the second fin structure, the second strained channel region having a second material concentration profile different from the first material concentration profile.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a p-well region;
   a first fin structure and a second fin structure protruding from the p-well region;
   an n-well region;
   a third fin structure protruding from the n-well region;
   a first strained channel region in the first fin structure, the first strained channel region having a first material concentration profile; and
   a second strained channel region in the second fin structure, the second strained channel region having a second material concentration profile different from the first material concentration profile.

2. The device of claim 1, wherein the second fin structure includes a silicon core separating adjacent portions of the second strained channel region.

3. The device of claim 1, wherein the first material concentration profile includes a uniform germanium concentration profile.

4. The device of claim 1, wherein the second material concentration profile includes a gradient germanium concentration profile.

5. The device of claim 4, wherein the gradient germanium concentration profile includes a germanium concentration in a range from about 25 atomic percent to about 65 atomic percent.

6. The device of claim 1, further comprising:
   a gate dielectric layer over the first fin structure, the second fin structure, and the third fin structure;
   a work function layer selectively disposed over the first fin structure and the second fin structure; and
   a gate electrode layer disposed over the first fin structure, the second fin structure, and the third fin structure.

7. The device of claim 6, wherein the work function layer comprises TiN, TaN, Ru, Mo, Al, W, WCN, TSN, TiAlC, WN, ZrSi$_2$, MoSi$_2$, TaSi$_2$, NiSi$_2$, or WN.

8. A semiconductor structure, comprising:
   a first fin structure and a second fin structure over a first region of a substrate;
   a third fin structure over a second region of the substrate;
   a gate dielectric layer over the first fin structure, the second fin structure, and the third fin structure;
   a work function layer selectively disposed over the first fin structure and the second fin structure; and
   a gate electrode layer over the first fin structure, the second fin structure, and the third fin structure,
   wherein the first fin structure comprises a uniform germanium concentration,
   wherein the second fin structure comprises a germanium concentration profile from a surface of the second fin structure to a diffusion depth from the surface of the second fin structure,
   wherein the third fin structure is substantially free of germanium.

9. The semiconductor structure of claim 8, wherein the diffusion depth is between about 1 nm and about 2 nm.

10. The semiconductor structure of claim 9,
    wherein the germanium concentration profile comprises a first concentration at the surface of the second fin structure and a second concentration at the diffusion depth,
    wherein the first concentration is about 35%,
    wherein the second concentration is about 10%.

11. The semiconductor structure of claim 9, wherein the uniform germanium concentration is between about 20% and about 35%.

12. The semiconductor structure of claim 9, further comprising:
    a first dielectric layer between the first fin structure and the second fin structure;
    a second dielectric layer between the second fin structure and the third fin structure; and
    a dielectric liner disposed between the first dielectric layer and the substrate and disposed between the second dielectric layer and the substrate.

13. The semiconductor structure of claim 12, wherein a composition of the first dielectric layer and the second dielectric layer is different from a composition of the dielectric liner.

14. The semiconductor structure of claim 12, further comprising:
    a first dielectric fin disposed over and in contact with the first dielectric layer; and
    a second dielectric fin disposed over and in contact with the second dielectric layer.

15. The semiconductor structure of claim 14, wherein the work function layer is disposed over the first dielectric fin but is not disposed over the second dielectric fin.

16. A semiconductor structure, comprising:
    a first fin structure and a second fin structure over a first region of a substrate;
    a first dielectric fin between the first fin structure and the second fin structure;
    a third fin structure over a second region of the substrate;
    a second dielectric fin between the second fin structure and the third fin structure; and
    a gate structure over the first fin structure, the second fin structure, the first dielectric fin, the third fin structure, and the second dielectric fin,
    wherein the first fin structure comprises a first strained channel region,
    wherein the second fin structure comprises a second strained channel region,
    wherein the first strained channel region comprises a homogeneous germanium concentration,
    wherein the second strained channel region comprises a germanium concentration profile from a surface of the second fin structure to a diffusion depth from the surface of the second fin structure,
    wherein the third fin structure is substantially free of germanium.

17. The semiconductor structure of claim 16, wherein the diffusion depth is between about 1 nm and about 2 nm.

18. The semiconductor structure of claim 16,
    wherein the germanium concentration profile comprises a first concentration at the surface of the second fin structure and a second concentration at the diffusion depth,
    wherein the first concentration is about 35%,
    wherein the second concentration is about 10%.

19. The semiconductor structure of claim 16, wherein the homogeneous germanium concentration is between about 20% and about 35%.

20. The semiconductor structure of claim 16, wherein the gate structure comprises:
- a gate dielectric layer over the first fin structure, the second fin structure, and the third fin structure;
- a work function layer selectively disposed over the first fin structure and the second fin structure; and
- a gate electrode layer over the first fin structure, the second fin structure, and the third fin structure.

* * * * *